United States Patent
Terayama et al.

(10) Patent No.: US 9,116,431 B2
(45) Date of Patent: Aug. 25, 2015

(54) DEVELOPMENT PROCESSING APPARATUS

(71) Applicant: Kabushiki Kaisha Toshiba, Tokyo (JP)

(72) Inventors: Masatoshi Terayama, Kawasaki (JP); Hideaki Sakurai, Kawasaki (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 361 days.

(21) Appl. No.: 13/778,928

(22) Filed: Feb. 27, 2013

(65) Prior Publication Data

US 2013/0321784 A1 Dec. 5, 2013

(30) Foreign Application Priority Data

May 31, 2012 (JP) ................. 2012-124786

(51) Int. Cl.
*G03D 5/00* (2006.01)
*G03F 7/20* (2006.01)
*G03F 7/30* (2006.01)

(52) U.S. Cl.
CPC ............ *G03F 7/2022* (2013.01); *G03F 7/3028* (2013.01)

(58) Field of Classification Search
CPC .............................. G03F 7/2022; G03F 7/3028
USPC ....................................................... 396/611
See application file for complete search history.

(56) References Cited

U.S. PATENT DOCUMENTS

| | | | |
|---|---|---|---|
| 6,752,545 B2 * | 6/2004 | Nakagawa et al. | 396/611 |
| 7,022,190 B2 * | 4/2006 | Matsuyama | 118/692 |
| 7,334,202 B1 * | 2/2008 | Singh et al. | 716/132 |
| 2010/0129737 A1 * | 5/2010 | Sakurai et al. | 430/5 |

FOREIGN PATENT DOCUMENTS

| | | |
|---|---|---|
| JP | 9-218500 | 8/1997 |
| JP | 2009-170502 | 7/2009 |
| JP | 2010-127982 | 6/2010 |

* cited by examiner

*Primary Examiner* — Rodney Fuller
(74) *Attorney, Agent, or Firm* — Finnegan, Henderson, Farabow, Garrett & Dunner, LLP

(57) ABSTRACT

According to one embodiment, a development processing apparatus including a film reduction amount calculation unit configured to calculate a film reduction amount of a to-be-exposed portion of the photosensitive film, a dimension prediction unit configured to calculate predicted pattern dimension when the developing process is performed in a standard development condition, a dimension correction amount calculation unit configured to calculate a pattern dimension correction amount, a corrected development condition derivation unit configured to derive a corrected development condition based on the calculated pattern dimension correction amount, and a developing mechanism configured to develop the photosensitive film in the derived corrected development condition.

20 Claims, 7 Drawing Sheets

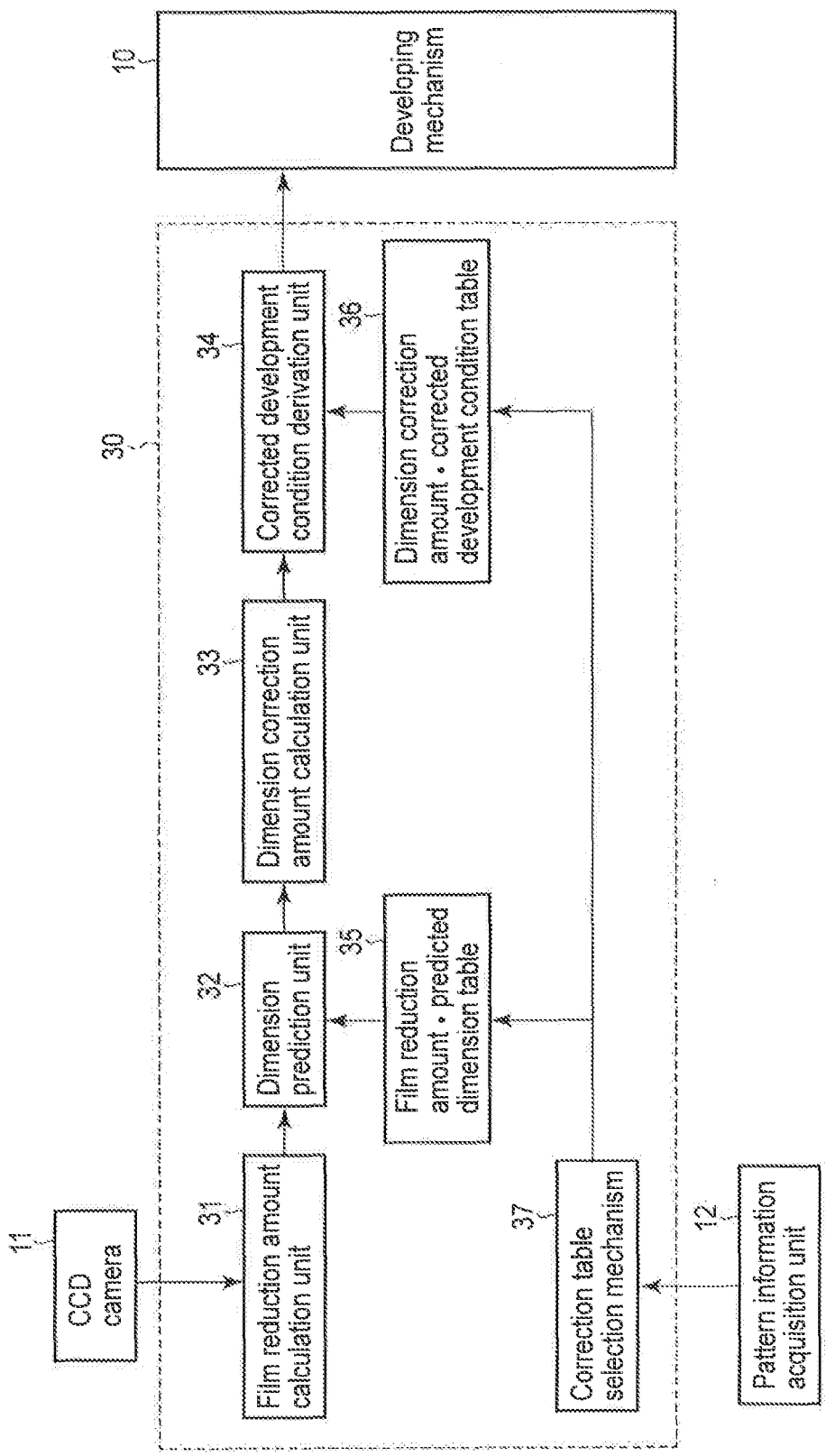
F I G. 1

| Pattern type | Pattern dimension | Drawing rate | Correction table |
|---|---|---|---|
| LS | ~200mm | ~10% | A |
| | | 10~30% | B |
| | | 30%~ | C |
| | 200mm~ | ~20% | D |
| | | 20%~ | E |
| CH | all | all | F |

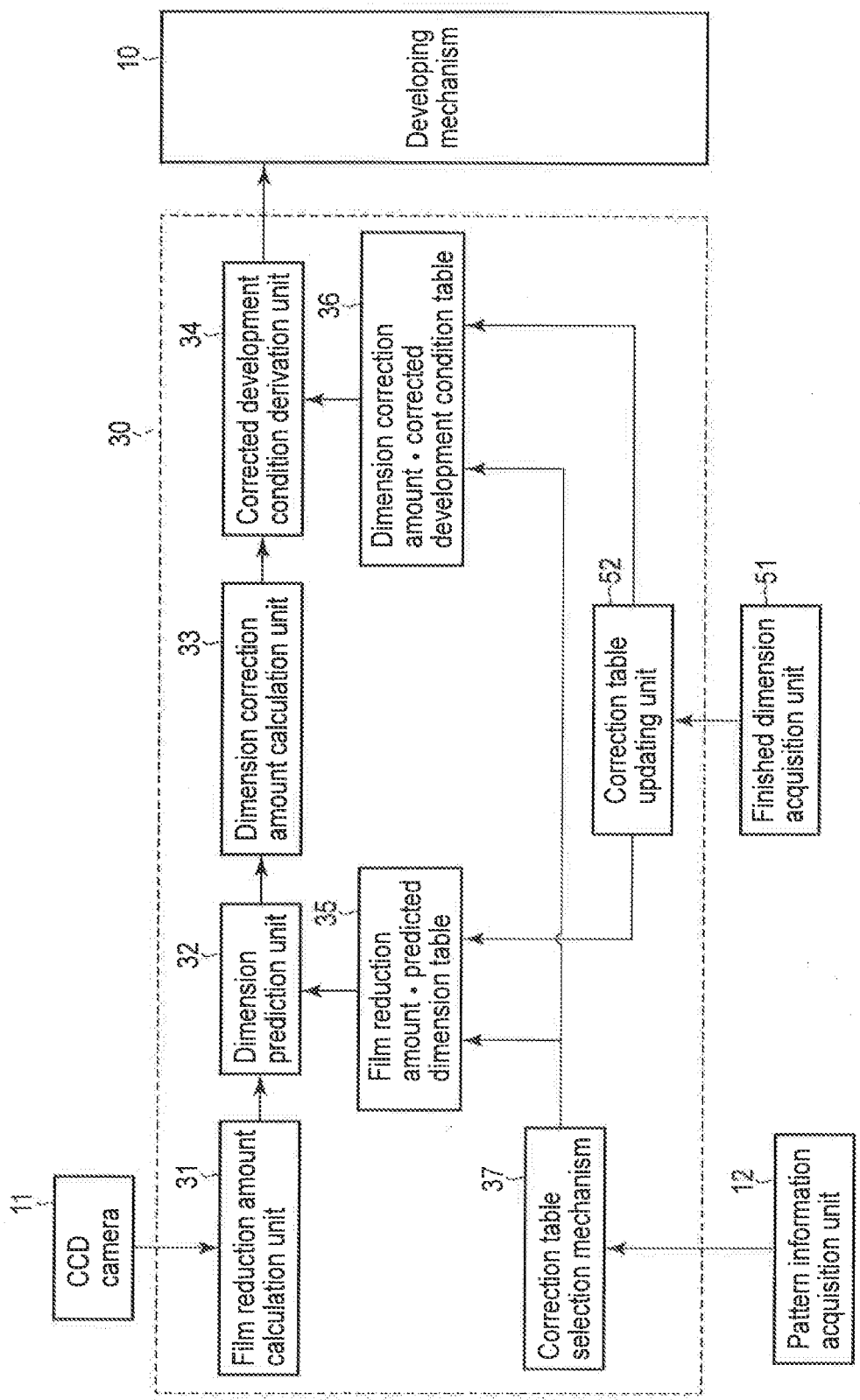
F I G. 8

DEVELOPMENT PROCESSING APPARATUS

CROSS-REFERENCE TO RELATED APPLICATIONS

This application is based upon and claims the benefit of priority from Japanese Patent Application No. 2012-124786, filed May 31, 2012, the entire contents of which are incorporated herein by reference.

FIELD

Embodiments described herein relate generally to a development processing apparatus for substrates used in fields of a mask manufacturing process, semiconductor manufacturing process, liquid crystal substrate manufacturing process, color filter manufacturing process and the like.

BACKGROUND

With a reduction in the sizes of semiconductor devices, the precision required for the pattern dimension becomes higher. Particularly, the dimensional precision for a photomask used as an original of a pattern is required to be extremely high.

As a factor for changing the pattern dimension, the sensitivity of resist coated on a substrate used when a photomask is formed, the reproducibility of processes in drawing, developing, etching steps and the like are given. Among them, the sensitivity difference of resists is considered to occur due to a factor that management of storage environment and refining and coating of resist are difficult and it becomes a serious problem in highly precise dimension control.

As a method for correcting the sensitivity difference of resists, there is provided a method for predicting the final dimension by use of a relation between a previously acquired film reduction of an exposure portion and pattern dimension and deriving a corrected development time for attaining desired dimension based on the predicted dimension. However, unlike the wafer process, in the mask process, the dimensional control precision becomes greatly different depending on the layout even in a highly robust process in which layouts of various dimensions/coverage are used. Therefore, in the photomask manufacturing process, it is impossible to attain the sufficiently high correction precision of the dimensional variation caused by the sensitivity difference of resists.

BRIEF DESCRIPTION OF THE DRAWINGS

FIG. 1 is a block diagram showing the schematic configuration of a development processing apparatus according to a first embodiment.

FIG. 8 is a block diagram showing the schematic configuration of a development processing apparatus according to a third embodiment.

DETAILED DESCRIPTION

Figure 2:
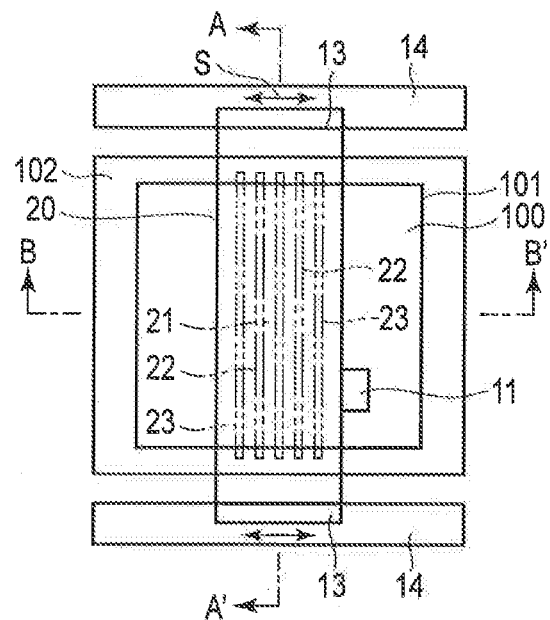
FIG. 2 is a plan view showing the schematic configuration of a developing mechanism used in the development processing apparatus of FIG. 1.

In general, according to one embodiment, a development processing apparatus comprises a pattern information acquisition unit configured to acquire pattern information exposed on a photosensitive film formed on a to-be-processed substrate, a film reduction amount calculation unit configured to calculate a film reduction amount of a to-be-exposed portion of the photosensitive film in a state in which at least part of the substrate is subjected to a semi-developing process to partly leave the to-be-exposed portion in a film thickness direction, a film reduction amount/predicted dimension table that stores a relationship between a previously acquired film reduction amount and predicted pattern dimension, a dimension prediction unit configured to calculate predicted pattern dimension when the developing process is performed in a standard development condition based on the measured film reduction amount with reference to the film reduction amount/predicted dimension table, a dimension correction amount calculation unit configured to calculate a pattern dimension correction amount to correct the calculated predicted pattern dimension to a desired value, a plurality of dimension correction amount/corrected development condition tables that store relationships between previously acquired pattern dimension correction amounts and corrected development conditions in correspondence to pattern types, a correction table selection mechanism configured to select one of the plural dimension correction amount/corrected development condition tables based on the acquired pattern information, a corrected development condition derivation unit configured to derive a corrected development condition that causes a dimensional variation of the pattern dimension correction amount based on the calculated pattern dimension correction amount by referring to the selected dimension correction amount/corrected development condition table, and a developing mechanism configured to develop the to-be-processed substrate in the derived corrected development condition.

A development processing apparatus of the present embodiment is explained below with reference to the drawings.

(First Embodiment)

As a first embodiment, a case wherein a to-be-processed substrate on which resist is coated to form a photomask and a pattern is exposed by use of an electron beam is subjected to a developing process is explained.

In this embodiment, a case wherein the developing process is performed by scanning a nozzle substantially in a horizontal direction with respect to the to-be-processed substrate while discharge/suction of a developing solution from the development nozzle and discharge of a rinse are simultaneously performed is taken as an example and explained. In this case, however, the development method/device taken as the example is not limitative if a development method/device that can perform the developing process to partly leave the resist of the to-be-exposed portion in the film thickness direction is used.

FIG. 1 is a block diagram showing the schematic configuration of a development processing apparatus according to a first embodiment.

The apparatus includes a developing mechanism 10 configured to develop a photosensitive film on a to-be-processed substrate, a CCD camera 11 that measures the film thickness of the photosensitive film, a pattern information acquisition unit 12 that acquires information of a pattern to be formed on the to-be-processed substrate, and a control unit 30 that sets a development condition in the developing mechanism 10 based on information items acquired from the CCD camera 11 and pattern information acquisition unit 12.

Figure 3:
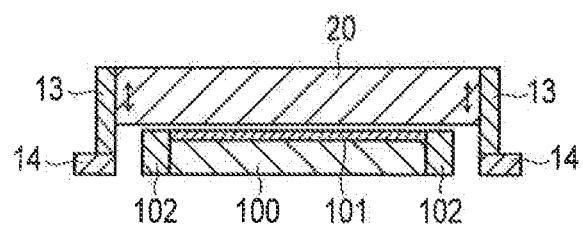
FIG. 3 is a cross-sectional view taken along the arrows A-A' of FIG. 2.
Figures 4, 5:
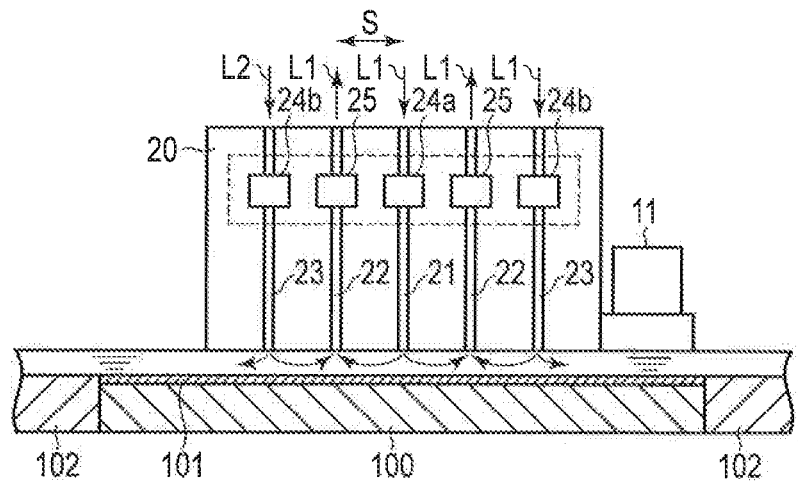
FIG. 4 is a cross-sectional view taken along the arrows B-B' of FIG. 2.
FIG. 5 is a schematic diagram showing one example of a correction table used in the development processing apparatus of FIG. 1.

The developing mechanism 10 is configured as shown in FIGS. 2 to 4. FIG. 2 is a plan view showing the schematic configuration of the developing mechanism 10, FIG. 3 is a cross-sectional view taken along the arrows A-A' of FIG. 2 and FIG. 4 is a cross-sectional view taken along the arrows B-B' of FIG. 2.

As shown in FIG. 2, the developing mechanism 10 includes a developing head 20, film thickness measuring unit 11 (CCD camera), gap adjusting mechanism 13 and moving mechanism 14. The developing head 20 develops a resist film 101 by moving in parallel with scanning direction S on a to-be-processed substrate 100 while developing solution L1 is being discharged and suctioned. The film thickness measuring unit 11 is mounted on the developing head 20 and measures the film thickness of the resist film 101. The gap adjusting mechanism 13 moves the developing head 20 in a vertical direction with respect to the to-be-processed substrate 100 to adjust a gap between the developing head 20 and the to-be-processed substrate 100. The moving mechanism 14 moves the developing head 20 in scanning direction S.

As shown in FIG. 3, the to-be-processed substrate 100 is a transparent substrate formed of, for example, quartz glass and is held with the upper surface thereof set at the height equal to that of an auxiliary plate 102. Further, a photosensitive agent is uniformly coated to a thickness of 160 nm, for example, on the upper surface of the to-be-processed substrate 100 to form a resist film 101. A preset pattern is exposed on the resist film 101 by means of an exposure apparatus. In this embodiment, a portion to be developed in a developing process by use of a positive photosensitive agent is an exposure portion exposed by means of the exposure apparatus. A negative photosensitive agent may be used and, in this case, a portion to be developed in a developing process is an unexposed portion that is not exposed by means of the exposure apparatus.

As shown in FIG. 4, the developing head 20 includes a developing solution discharging nozzle 21 that is a developing solution discharging unit provided in the central portion of the developing head 20, developing solution suction nozzles 22 that are developing solution suction units provided on both sides of the developing solution discharging nozzle 21, and rinse discharging nozzles 23 provided outside the developing solution suction nozzles 22. In this embodiment, the moving head 20 is moved in parallel by means of the moving mechanism 14, but it is sufficient if the developing head 20 and to-be-processed substrate 100 are relatively moved. Therefore, the to-be-processed substrate 100 may be moved or both of the developing head 20 and to-be-processed substrate 100 may be moved.

The developing solution discharging nozzle 21 discharges developing solution L1 supplied from a tank (not shown) onto the to-be-processed substrate 100 when an electromagnetic valve 24a connected to the tank for storage of the developing solution is opened. The rinse discharging nozzle 23 discharges rinse L2 supplied from a tank (not shown) onto the to-be-processed substrate 100 when an electromagnetic valve 24b connected to the tank for storage of the rinse is opened. When a pump 25 is driven, the developing solution suction nozzles 22 suction developing solution L1 and rinse L2 on the resist film 101.

The CCD camera 11 is mounted on the developing head 20, measures the luminance of reflection light according to received reflection light and supplies luminance information indicating the luminance to the control unit 30. Then, the film reduction amount of the resist film 101 is calculated by means of a film reduction amount calculation unit 31 of the control unit 30.

The control unit 30 includes the film reduction amount calculation unit 31, dimension prediction unit 32, dimension correction amount calculation unit 33, corrected development condition derivation unit 34, film reduction amount/predicted dimension table 35, dimension correction amount/corrected development condition table 36, correction table selection mechanism 37 and the like.

In the film reduction amount calculation unit 31, the film reduction amount of the resist film 101 on the to-be-processed substrate 100 is calculated based on a photographing signal of the CCD camera 11 in a state in which the resist film 101 of a portion (monitor region) other than a pattern region on the to-be-processed substrate 100 is semi-developed. Specifically, the film reduction amount of the resist film 101 is calculated by comparing the luminance before the semi-development and the luminance after the semi-development obtained by the CCD camera 11. In the dimension prediction unit 32, pattern dimension is calculated based on the film reduction amount/predicted dimension table 35 according to the film reduction amount calculated by means of the film reduction amount calculation unit 31. In the dimension correction amount calculation unit 33, a pattern dimension correction amount used for correcting the predicted pattern dimension calculated by means of the dimension prediction unit 32 to a desired value is calculated. In the corrected development condition derivation unit 34, a corrected development condition that causes a dimensional variation of the pattern dimension correction amount is derived based on the dimension correction amount/corrected development condition table 36 according to a pattern dimension correction amount calculated by means of the dimension correction amount calculation unit 33.

In this case, the film reduction amount/predicted dimension table 35 stores the relationship between the previously acquired pattern dimension correction amount and corrected development condition and, as shown in FIG. 5, a plurality of relationships are stored therein according to the pattern types, pattern dimensions, drawing rates and the like. Further, the dimension correction amount/corrected development condition table 36 stores the relationship between the previously acquired pattern dimension correction amount and corrected development condition and stores a plurality of relationships like the table 35. An optimum one of the tables 35 and 36 is selected based on pattern information acquired by the pattern information acquisition unit 12 by means of the correction table selection mechanism 37.

Figure 6:
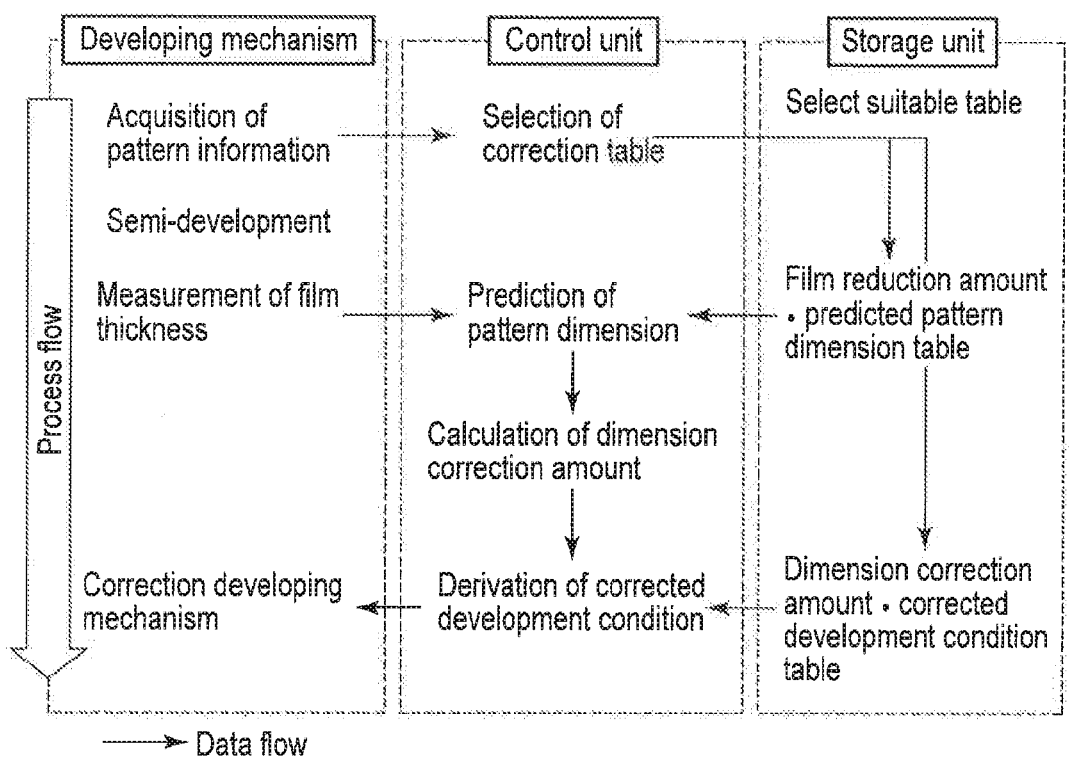
FIG. 6 is a diagram showing a processing flow for illustrating a first embodiment.

Next, the development processing method using the present device is explained with reference to the process flow of FIG. 6. In FIG. 6, processes corresponding to the developing mechanism, control unit and storage unit are separately described for the respective units. Arrows in the drawing indicate the flow of the process.

First, at the start time of the process, pattern information of a to-be-processed photomask is acquired by means of the pattern information acquisition unit 12. As the pattern information, a pattern type, pattern dimension, drawing rate, coverage, permissible dimensional width, permissible through-pitch difference (mask PPE: permissible width by a process in a proximity region), layer name and the like are given. However, the pattern information is not limited to the above items and it is not required to acquire all of the above items. Further, as the acquisition mechanism, a mechanism of manual inputting by an operator, barcode reading, downloading from the network of a manufacturing system or the like may be provided.

After acquisition of the pattern information, the developing nozzle 20 is scanned at high speed on part of the to-be-processed substrate 100. As a result, a portion that is a part of a to-be-exposed portion and includes a portion (that is hereinafter called a monitor pattern) used for film thickness measurement is subjected to a developing process (semi-development) to partly leave the resist film 101 in the film thickness direction. At this time, a development processing condition is determined to cause a film reduction amount as large as possible in a range that the film thickness measuring mechanism (CCD camera 11) has sufficiently high sensitivity. As a result, the dimension correction precision can be enhanced.

The film reduction amount of the resist film 101 is calculated based on a photographing signal of the CCD camera 11 by means of the film reduction amount calculation unit 31. As a method/device that measures the film thickness of a monitor pattern, it is possible in this embodiment to provide a method/device for acquiring light interfered by the resist film 101 of the monitor pattern by means of the CCD camera 11 to calculate the film thickness according to luminance information of a CCD image while a single-color light source with the wavelength that does not expose the resist is used as an illumination light source.

However, the method/device is not limited to the above method/device and a reflection spectral film thickness gauge, ellipsometer, AFM and the like may be used. In order to calculate a film reduction amount due to the monitor pattern development, it is preferable to use a mechanism that performs the film thickness measurement of the monitor pattern before and after the development. However, this is not limitative and a value previously measured by use of another device, resist coating specification value or the like may be used as the film thickness before the development. Further, it is desirable to use a mechanism that adequately performs the reference measurement to calibrate the light source and CCD camera 11.

Next, an optimum one of the film reduction amount/predicted dimension tables 35 is selected based on previously acquired pattern information by means of the correction table selection mechanism 37. Then, predicted dimension is calculated based on the selected table by means of the pattern dimension prediction unit 32.

Since the film reduction amount of the monitor pattern has a correlation with the sensitivity of the resist, that is, the dimension obtained when the standard development is performed in the same system, the dimension can be predicted based on the film reduction amount. As the film reduction amount/predicted dimension table 35 used at this time, a table suitable for the layout of the to-be-processed substrate 100 is selected according to acquired pattern information. For example, if the drawing rate is 20% with the layout of line/space (L/S) of 160 nm, table B used in a region expressed by the pattern type: L/S, the pattern dimension: ~200 nm and the drawing rate: 10 to 30% is selected from FIG. 5. The type, the numerical value and the division number of pattern information items used when the table shown here is divided are provided only as one example, and the contents of this embodiment are not limited to this case. The correction tables are not necessarily provided by a limited number in a certain section, but may be caused to function according to pattern information.

Next, a pattern dimension correction amount is calculated based on the acquired predicted dimension by means of the dimension correction amount calculation unit 33. If the predicted dimension is calculated as (target dimension−3 nm), for example, the dimension correction amount used for correction to a desired dimension becomes +3 nm. In this case, a development condition in which the finished dimension becomes larger by +3 nm than in the standard development condition is derived. Like the film reduction amount/predicted dimension table 35, an optimum one of the dimension correction amount/corrected development condition tables 36 adequately used at this time for the layout of the to-be-processed substrate 100 is selected according to the acquired pattern information. The table dividing method may be the same as that of the film reduction amount/predicted dimension table 35 or a mechanism that uses the types or numerical values of different pattern information items may be provided.

As the corrected development condition, a development time, developing solution temperature, developing solution flow rate, developing solution concentration and the like can be given. However, the condition is not limited to the above items and can be variously changed and, for example, it can be set to a combination of the above items. A mechanism that determines whether or not a through-pitch variation caused when the developing process is performed in the corrected development condition is set within a preset range may be provided to keep unchanged the exposure characteristic for a thick pattern of, for example, a peripheral circuit and a thin pattern such as an auxiliary pattern in addition to the dimension of a pattern used as a target when the developing process is performed in the corrected development condition. Also, with respect to the corrected development condition through-pitch table used at this time, a mechanism that selects a table suitable for the layout of the to-be-processed substrate according to the acquired pattern information may be provided.

As the corrected development condition, a development time, developing solution temperature, developing solution flow rate, developing solution concentration and the like can be given. However, the condition is not limited to the above items and can be variously changed and, for example, it can be set to a combination of the above items. It is possible to provide a mechanism that determines whether or not a through-pitch variation amount is set within a certain range when the developing process is performed in the corrected development condition. Specifically, it is possible to provide a mechanism that determines whether or not a through-pitch variation amount is set in a certain range when the developing process is performed in the corrected development condition to keep unchanged the exposure characteristic for a thick pattern of, for example, a peripheral circuit and a thin pattern such as an auxiliary pattern in addition to the dimension of a pattern used as a target. Also, with respect to the corrected development condition through-pitch table used at this time, a mechanism that selects a table suitable for the layout of the to-be-processed substrate according to the acquired pattern information may be provided.

Next, the corrected developing process is performed with respect to the pattern region of the to-be-processed substrate 100 by using the corrected development condition output from the control unit 30. At this time, the corrected developing process may separately be performed in plural steps and different corrected development conditions may be used in the respective steps.

The sensitivity difference of resists that is a dimensional variation factor is considered to occur due to refining and coating of resist, storage environment and the like. It is extremely difficult to manage them and it becomes a serious problem in highly precise dimension control. For example, the resist sensitivity is calculated based on the developing speed of a monitor pattern (exposure portion) arranged in the mask and predicted dimension when the developing process is performed in the standard development condition is calculated before development of the main pattern. Thus, the development condition is automatically adjusted to finish the dimension of the main pattern to a desired value and the pattern dimension can be subjected to a feed-forward correction process. The factor that becomes extremely important at the correction time is a correction table (the relationship between the film reduction amount and the predicted pattern dimension and the relationship between the pattern dimension correction amount and the corrected development condition).

However, in the photomask, it is known that the pattern dimension may often become different due to the pattern layout (LS layout, CH layout, pattern dimension, drawing rate, coverage and the like) of the to-be-processed substrate even if the process is performed in the same processing condition. In a processing apparatus that processes various pattern layouts, there occurs a possibility that the feed-forward correction does not adequately function by use of a single correction table.

On the other hand, in this embodiment, a pattern dimension feed-forward correction process with higher precision can be performed by providing plural correction tables and automatically selecting a correction table suitable for the layout according to pattern information.

As described above, according to this embodiment, a pattern dimension feed-forward correction process with high precision can be performed even if the sensitivity of the photosensitive film is varied. Additionally, a feed-forward dimension correction process is performed by providing a plurality of film reduction amount/predicted dimension tables 35 and dimension correction amount/corrected development condition tables 36, acquiring pattern information when the developing process is performed and selecting a correction table suitable for the layout to be subjected to the developing process. As a result, higher dimension control precision can be achieved.

(Second Embodiment)

Figure 7:
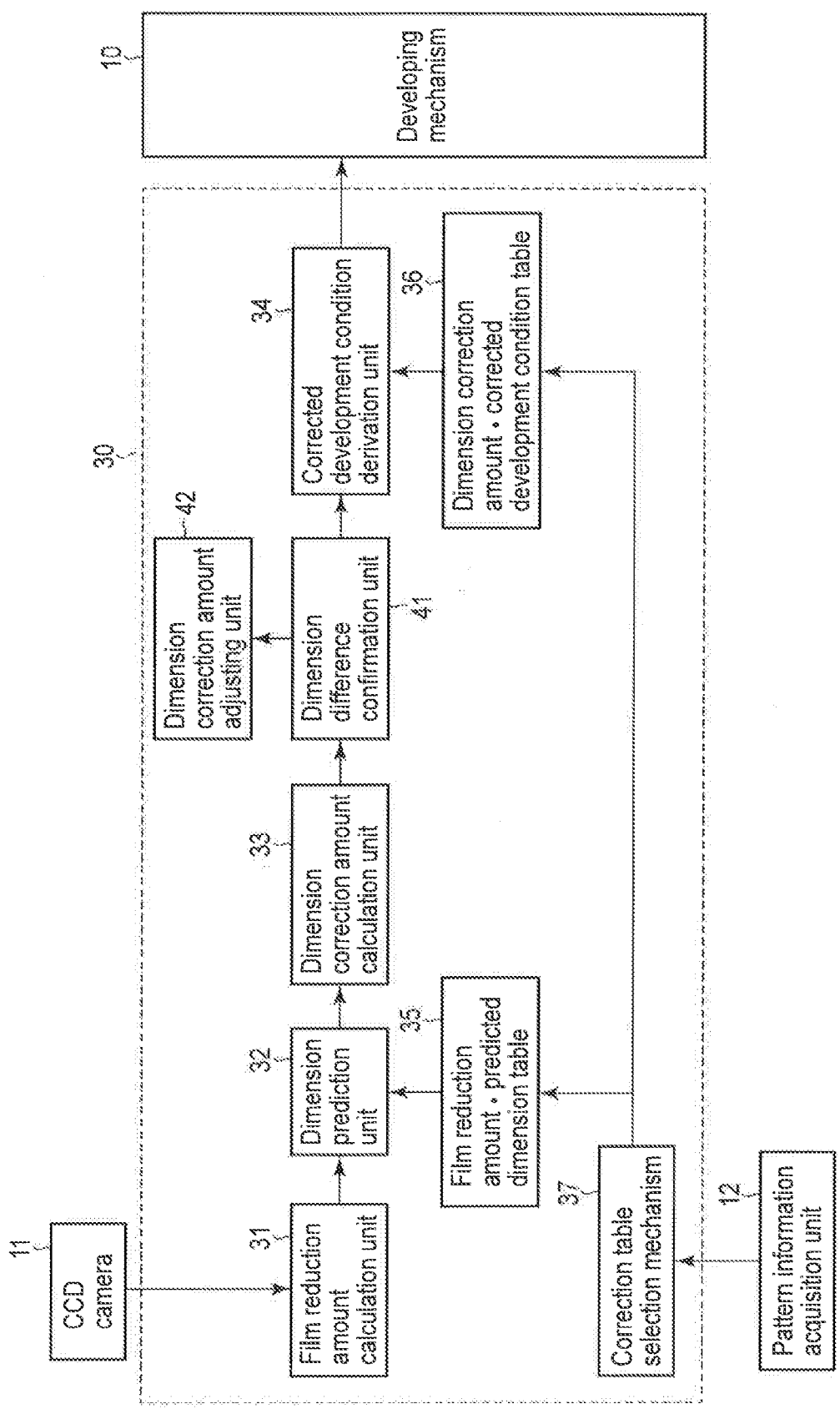
FIG. 7 is a block diagram showing the schematic configuration of a development processing apparatus according to a second embodiment.

FIG. 7 is a schematic configuration diagram showing a development processing apparatus according to a second embodiment. The same symbols are attached to the same portions as those of FIG. 1 and the detailed explanation thereof is omitted.

This embodiment is different from the first embodiment explained before in that a dimension difference confirmation unit 41 and dimension correction amount adjusting unit 42 are provided.

The relationship between a previously acquired corrected development condition and pattern-pattern dimension distribution (the distribution of through-pitches when the L/S dimension is swung in a matrix form) is derived. In the dimension difference confirmation unit 41, it is determined whether or not a difference between the pattern/pattern dimension distribution in the standard development condition and the pattern/pattern dimension distribution in the corrected development condition satisfies a permissible pattern/pattern dimension difference. That is, it is determined whether or not the range of the through-pitch process difference is set within the permissible pattern/pattern dimension difference. In this case, the permissible pattern/pattern dimension difference indicates a variation amount permitted for pattern dimensions between plural patterns in lithography and is set to satisfy the lithography tolerance.

If it is determined in the dimension difference confirmation unit 41 that the dimension correction amount lies within the permissible range, a corrected development condition is derived based on the pattern dimension correction amount in the corrected development condition derivation unit 34 as in the first embodiment. If it is determined in the dimension difference confirmation unit 41 that the permissible pattern/pattern dimension difference is not satisfied, a pattern dimension correction amount that simultaneously satisfies the permissible pattern dimension in a corrected development condition in which the permissible pattern/pattern dimension difference is satisfied is recalculated in the dimension correction amount adjusting unit 42. Then, a corrected development condition is derived based on the recalculated dimension correction amount by means of the corrected development condition derivation unit 34.

With the above configuration, the same effect as that of the first embodiment can naturally be obtained and even if the sensitivities of resist films formed on plural substrates vary, the pattern dimension can be controlled with high precision while desired lithography tolerance is secured and a dimension difference between pattern categories is suppressed. That is, in addition to the effect of the first embodiment, pattern dimension feed/forward correction that satisfies mask PPE compatibility can be made.

(Third Embodiment)

FIG. 8 is a schematic configuration diagram showing a development processing apparatus according to a third embodiment. The same symbols are attached to the same portions as those of FIG. 1 and the detailed explanation thereof is omitted.

This embodiment is different from the first embodiment explained before in that a table is updated according to the corrected development result. That is, in addition to the configuration of FIG. 1, a finished dimension acquisition unit 51 that acquires the dimension of a pattern finally formed and a correction table updating unit 52 that updates tables 35, 36 based on data of the finished dimension acquisition unit 51 are provided.

Figure 9:
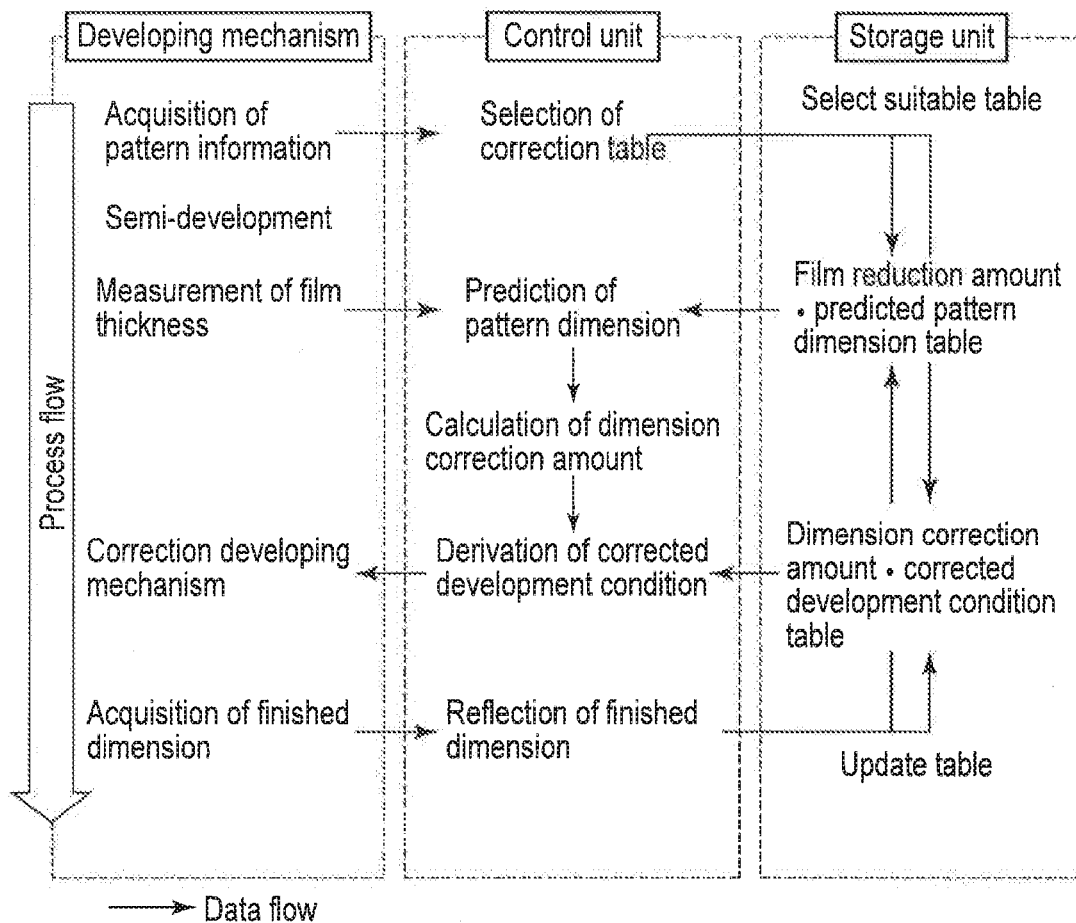
FIG. 9 is a diagram showing a processing flow for illustrating the third embodiment.

Next, the development processing method using the present apparatus is explained with reference to the process flow of FIG. 9. In FIG. 9, processes corresponding to a developing mechanism, control unit and storage unit are separately described for the respective units. Arrows in the drawing indicate the flow of the process.

The process from calculation of the corrected development condition until the corrected developing process is performed is the same as that of the first embodiment. In addition, in this embodiment, the dimension of a finally formed pattern is acquired by means of the finished dimension acquisition unit 51 after the developing process is completed as in the first embodiment. Then, in order to reflect the finished dimension, it is fed back to the tables 35, 36 by means of the correction table updating unit 52 to correct the tables 35, 36.

As the table correction method, a method for adding the dimension measurement result to the film reduction amount/predicted dimension table 35 to optimize the function or a method for giving a gain to and offsetting the dimension correction amount/corrected development condition table 36 may be provided. However, in this embodiment, the method is not limited to the above methods. Further, it is possible to further finely divide the correction table based on pattern information and form fine correction tables with respect to the pattern information.

Figure 10A:
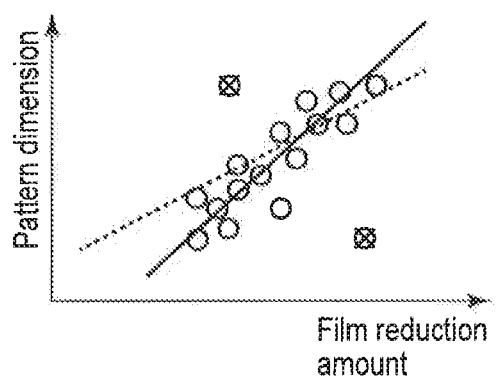
FIGS. 10A and 10B are diagrams showing the relationship between the pattern dimension and a film reduction amount for illustrating the third embodiment.

FIG. 10A is a diagram showing the relationship between tables before and after updating. In FIG. 10A, ○ indicates the pattern dimension measurement result and x indicates a deviated value. The broken lines indicate the characteristic of correction table B and the solid line indicates the characteristic of updated correction table B. The relationship between the film reduction amount and the pattern dimension measurement result becomes more precise by updating the table.

The correction table can be prevented from being degraded by removing dimensions of abnormal values from the actual dimensions of a to-be-processed substrate that is subjected to a corrected developing process and, as a result, pattern dimension feed/forward correction of higher precision can be made. The result of the pattern dimension actually measured may be varied if the correction table is updated, but the updated table becomes closer to the actual pattern dimension result.

Figure 10B:
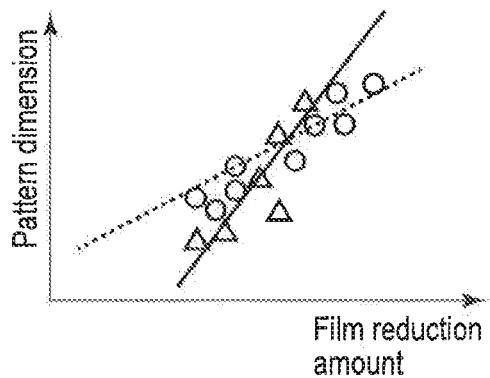

FIG. 10B is a diagram showing the relationship between a table before updating and a finely divided table. In FIG. 10B, ○ indicates the pattern dimension measurement result (the drawing rate is 10 to 20%), Δ indicates the pattern dimension measurement result (the drawing rate is 20 to 30%) and x indicates a deviated value. The broken lines indicate the characteristic of correction table B and the solid line indicates the characteristic of finely divided correction table B'.

When the developing process is performed by use of correction table B, the relationships between the film reduction amounts and the pattern dimensions in the drawing rate of 10 to 30% become relatively closer to one another. However, if the drawing rates of 10 to 20% and 20 to 30% are checked, it is understood that the drawing rate of 10 to 20% satisfactorily coincides with correction table B, but the drawing rate of 20 to 30% becomes closer to correction table B' rather than correction table B. In this case, more precise dimension control can be attained by finely dividing the correction table into the drawing rates of 10 to 20% and 20 to 30%.

Thus, according to this embodiment, the same effect as that of the first embodiment can naturally be attained, and the precision of the correction table can be enhanced and the correction table can be finely divided to cope with more precise pattern information by acquiring the dimension measurement result of a to-be-processed substrate 100 subjected to a corrected developing process and feeding back the result to the correction tables 35, 36. That is, a pattern dimension feed/forward correction process of higher precision suitable for various pattern layouts can be performed by adjusting the correction table by use of the actual dimension of the to-be-processed substrate that is subjected to the corrected developing process.

(Modification)

This invention is not limited to the above embodiments.

In the embodiments, a plurality of film reduction amount/predicted dimension tables and dimension correction amount/corrected development condition tables are prepared, but if the sufficient effect can be attained only by providing plural dimension correction amount/corrected development condition tables, one film reduction amount/predicted dimension table may be used.

Further, this embodiment is particularly effective for a photomask manufacturing process, but this is not necessarily limited to a photomask and can be applied to a semiconductor device manufacturing process (a process for developing a pattern formed on a semiconductor wafer).

In the embodiment, a portion (monitor region) of the to-be-processed substrate is semi-developed for calculation of the film reduction amount, but the embodiment is not limited to this case and the entire surface of the to-be-processed substrate may be semi-developed. In this case, the substrate may be semi-developed in a first development condition, then a second development condition may additionally be set according to the result of the film reduction amount due to semi-development and a developing process may be performed again for a pattern region in the second development condition.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A development processing apparatus comprising:
a film reduction amount calculation unit configured to calculate a film reduction amount of a to-be-exposed portion of a photosensitive film in a state in which at least part of the photosensitive film formed on a to-be-processed substrate is subjected to a semi-developing process to partly leave the to-be-exposed portion of the photosensitive film in a film thickness direction,
a dimension prediction unit configured to calculate predicted pattern dimension obtained when a developing process is performed in a standard development condition based on the calculated film reduction amount,
a dimension correction amount calculation unit configured to calculate a pattern dimension correction amount to correct the calculated predicted pattern dimension to a desired value,
a corrected development condition derivation unit configured to derive a corrected development condition that causes a dimensional variation of the pattern dimension correction amount based on the calculated pattern dimension correction amount, and
a developing mechanism configured to develop the to-be-processed substrate in the derived corrected development condition.

2. The device according to claim 1, further comprising a film reduction amount/predicted dimension table that stores a relationship between a previously acquired film reduction amount and predicted pattern dimension, the predicted pattern dimension being calculated by referring to the film reduction amount/predicted dimension table in the dimension prediction unit.

3. The device according to claim 1, further comprising a pattern information acquisition unit configured to acquire pattern information exposed on a photosensitive film formed on the to-be-processed substrate, a plurality of dimension correction amount/corrected development condition tables that store relationships between previously acquired pattern dimension correction amounts and corrected development conditions in correspondence to pattern types, and a correction table selection mechanism configured to select one of the plural dimension correction amount/corrected development condition tables based on the acquired pattern information, the corrected development condition being derived by referring to the selected dimension correction amount/corrected development condition table in the corrected development condition derivation unit.

4. The device according to claim 1, wherein a region in which the film reduction amount is calculated by means of the film reduction amount calculation unit is a monitor region other than a pattern region on the substrate and a region that is developed in the corrected development condition is the pattern region on the substrate.

5. A development processing apparatus comprising:
   a pattern information acquisition unit configured to acquire pattern information exposed on a photosensitive film formed on a to-be-processed substrate,
   a film reduction amount calculation unit configured to calculate a film reduction amount of a to-be-exposed portion of the photosensitive film in a state in which at least part of the substrate is subjected to a semi-developing process to partly leave the to-be-exposed portion in a film thickness direction,
   a film reduction amount/predicted dimension table that stores a relationship between a previously acquired film reduction amount and predicted pattern dimension,
   a dimension prediction unit configured to calculate predicted pattern dimension obtained when the developing process is performed in a standard development condition based on the calculated film reduction amount with reference to the film reduction amount/predicted dimension table,
   a dimension correction amount calculation unit configured to calculate a pattern dimension correction amount to correct the calculated predicted pattern dimension to a desired value,
   a plurality of dimension correction amount/corrected development condition tables that store relationships between previously acquired pattern dimension correction amounts and corrected development conditions in correspondence to pattern types,
   a correction table selection mechanism configured to select one of the plural dimension correction amount/corrected development condition tables based on the acquired pattern information,
   a corrected development condition derivation unit configured to derive a corrected development condition that causes a dimensional variation of the pattern dimension correction amount based on the calculated pattern dimension correction amount by referring to the selected dimension correction amount/corrected development condition table, and
   a developing mechanism configured to develop the to-be-processed substrate in the derived corrected development condition.

6. The device according to claim 5, wherein the film reduction amount/predicted dimension table includes a plurality of film reduction amount/predicted dimension tables corresponding to pattern types and one of the film reduction amount/predicted dimension tables is selected based on the acquired pattern information by means of the table selection mechanism.

7. The device according to claim 5, wherein a region in which the film reduction amount is calculated by means of the film reduction amount calculation unit is a monitor region other than a pattern region on the substrate and a region that is developed in the corrected development condition is the pattern region on the substrate.

8. The device according to claim 5, further comprising a pattern/pattern dimension difference confirmation unit configured to determine whether a difference between pattern/pattern dimension distribution in the standard development condition and pattern/pattern dimension distribution in the corrected development condition satisfies a permissible pattern/pattern dimension difference, and a dimension correction amount adjusting unit configured to recalculate a pattern dimension correction amount that simultaneously satisfies the permissible pattern dimension in a corrected development condition in which the permissible pattern/pattern dimension difference is satisfied when the permissible pattern/pattern dimension difference is not satisfied.

9. The device according to claim 5, further comprising a finished dimension acquisition unit configured to acquire a pattern dimension measurement result of the to-be-processed substrate subjected to a developing process in the derived corrected development condition, and a correction table updating mechanism configured to update the selected dimension correction amount/corrected development condition table according to the acquired pattern dimension measurement result.

10. The device according to claim 5, wherein the developing mechanism includes a substrate holding mechanism configured to substantially horizontally hold the to-be-processed substrate, a developing head having a developing solution discharge opening and developing solution suction opening and a scanning mechanism configured to relatively and substantially horizontally move the to-be-processed substrate and developing head.

11. The device according to claim 10, wherein the developing mechanism has a rinse discharge opening provided together with the developing solution discharge opening and developing solution suction opening in the developing head.

12. The device according to claim 10, wherein the developing mechanism further includes a CCD camera provided on the developing head to measure film thickness of the photosensitive film on the substrate.

13. The device according to claim 12, wherein the film reduction amount calculation unit calculates a film reduction amount of the to-be-exposed portion based on a photographing signal of the CCD camera.

14. A development processing apparatus comprising:
   a pattern information acquisition unit configured to acquire pattern information exposed on a photosensitive film formed on a to-be-processed substrate,
   a film reduction amount calculation unit configured to calculate a film reduction amount of a to-be-exposed portion of the photosensitive film in a state in which a monitor region of the substrate is subjected to a semi-developing process to partly leave the to-be-exposed portion in a film thickness direction,
   a plurality of film reduction amount/predicted dimension tables that store relationships between previously acquired film reduction amounts and predicted pattern dimensions in correspondence to pattern types,
   a plurality of dimension correction amount/corrected development condition tables that store relationships between previously acquired pattern dimension correction amounts and corrected development conditions in correspondence to pattern types,
   a correction table selection mechanism configured to select one of the plural film reduction amount/predicted dimension tables and one of the plural dimension correction amount/corrected development condition tables based on the acquired pattern information,
   a dimension prediction unit configured to calculate predicted pattern dimension obtained when the developing process is performed in a standard development condition based on the calculated film reduction amount with reference to the selected film reduction amount/predicted dimension table, a dimension correction amount calculation unit configured to calculate a pattern dimension correction amount to correct the calculated predicted pattern dimension to a desired value, a corrected development condition derivation unit configured to derive a corrected development condition that causes a dimensional variation of the pattern dimension correction amount based on the calculated pattern dimension correction amount by referring to the selected dimension correction amount/corrected development condition table, and a developing mechanism including a substrate holding mechanism configured to substantially horizontally hold the to-be-processed substrate, a developing solution discharge and suction mechanism having a developing solution discharge opening and developing solution suction opening and a scanning mechanism configured to relatively and substantially horizontally move the to-be-processed substrate and developing solution discharge and suction mechanism and configured to develop a pattern region of the to-be-processed substrate in the derived corrected development condition.

15. The device according to claim 14, wherein a region that is developed in the corrected development condition is the pattern region other than the monitor region on the substrate.

16. The device according to claim 14, further comprising a pattern/pattern dimension difference confirmation unit configured to determine whether a difference between pattern/pattern dimension distribution in the standard development condition and pattern/pattern dimension distribution in the corrected development condition satisfies a permissible pattern/pattern dimension difference, and a dimension correction amount adjusting unit configured to recalculate a pattern dimension correction amount that simultaneously satisfies permissible pattern dimension in a corrected development condition in which the permissible pattern/pattern dimension difference is satisfied when the permissible pattern/pattern dimension difference is not satisfied.

17. The device according to claim 14, further comprising a finished dimension acquisition unit configured to acquire a pattern dimension measurement result of the to-be-processed substrate subjected to a developing process in the derived corrected development condition, and a correction table updating mechanism configured to update the selected film reduction amount/predicted dimension table and the selected dimension correction amount/corrected development condition table based on the acquired pattern dimension measurement result.

18. The device according to claim 14, wherein the developing mechanism includes a substrate holding mechanism configured to substantially horizontally hold the to-be-processed substrate, a developing head having a developing solution discharge opening and developing solution suction opening and a scanning mechanism configured to relatively and substantially horizontally move the to-be-processed substrate and developing head.

19. The device according to claim 18, wherein the developing mechanism has a rinse discharge opening provided together with the developing solution discharge opening and developing solution suction opening in the developing head.

20. The device according to claim 18, wherein the developing mechanism further includes a CCD camera provided on the developing head to measure film thickness of the photosensitive film on the substrate.

\* \* \* \* \*